(12) United States Patent
Jia et al.

(10) Patent No.: US 8,957,705 B2
(45) Date of Patent: Feb. 17, 2015

(54) PHASE FREQUENCY DETECTOR

(75) Inventors: Wenyan Jia, San Jose, CA (US);
Shenggao Li, Pleasanton, CA (US);
Fulvio Spagna, San Jose, CA (US)

(73) Assignee: Intel Corporation, Santa Clara, CA (US)

(*) Notice: Subject to any disclaimer, the term of this patent is extended or adjusted under 35 U.S.C. 154(b) by 36 days.

(21) Appl. No.: 13/617,233

(22) Filed: Sep. 14, 2012

(65) Prior Publication Data

US 2014/0077841 A1    Mar. 20, 2014

(51) Int. Cl.
*H03D 13/00* (2006.01)

(52) U.S. Cl.
USPC ...... 327/3; 327/9; 327/12; 327/156; 327/159; 331/25; 375/376

(58) Field of Classification Search
USPC ............. 327/2, 3, 5, 7–10, 12, 147, 150, 156, 327/159; 331/17, 25; 375/373, 376
See application file for complete search history.

(56) References Cited

U.S. PATENT DOCUMENTS

| | | | |
|---|---|---|---|
| 6,870,432 B2 | 3/2005 | Li et al. | |
| 6,954,110 B2 | 10/2005 | Li et al. | |
| 7,366,427 B2 | 4/2008 | Li | |
| 7,421,052 B2 | 9/2008 | Li | |
| 7,714,668 B2* | 5/2010 | Yoshida et al. | 331/16 |
| 8,283,984 B2* | 10/2012 | Lin | 331/11 |
| 8,427,243 B2* | 4/2013 | Chen et al. | 331/1 A |
| 8,520,428 B2 | 8/2013 | Helder et al. | |
| 8,638,146 B1* | 1/2014 | Lamanna et al. | 327/159 |
| 8,749,289 B2 | 6/2014 | Li et al. | |
| 2007/0009267 A1 | 1/2007 | Crews et al. | |
| 2010/0195779 A1* | 8/2010 | Sai | 375/376 |
| 2013/0057327 A1* | 3/2013 | Ferriss et al. | 327/156 |

OTHER PUBLICATIONS

Staszewski, R. B., et al., "All-Digital TX Frequency Synthesizer and Discrete-Time Receiver for Bluetooth Radio in 130-nm CMOS", IEEE J. Solid-State Circuits, vol. 39, No. 12, pp. 2278-2291, Dec. 2004.
Rahkonen, T., et al., "The Use of Stabilized CMOS Delay Line for the Digitization of Short Time Intervals", IEEE J. Solid-State Circuits, vol. 28, pp. 887,894, Aug. 1993.
Straayer, M., et al., "An Efficient High-Resolution 11-bit Noiseshaping Multipath Gated Ring Oscillator", in VLSI Symp. Dig. Tech. Papers, Jun. 2008, pp. 82-83.
Da Dalt, N., et al., "A Design-Oriented Study of Nonlinear Dynamics of Digital Bang-Bang PLLs", in IEEE Trans. Circuits syst. I: Regular Papers, vol. 52, No. 1, Jan. 2005, pp. 21-31.
Tierno, J. A., et al, "A Wide Power Supply Range, Wide Tuning Range, All Static CMOS All Digital PLL in 65 nm SOI", IEEE J. Solid-State Circuits vol. 43, No. 1, pp. 42-51, Jan. 2008.

* cited by examiner

*Primary Examiner* — Patrick O'Neill
(74) *Attorney, Agent, or Firm* — Blakely, Sokoloff, Taylor & Zafman LLP

(57) ABSTRACT

Described is an apparatus comprising: a first phase frequency detector (PFD) to determine a coarse phase difference between a first clock signal and a second clock signal, the first PFD to generate a first output indicating the coarse phase difference; and a second PFD, coupled to the first PFD, to determine a fine phase difference between the first clock signal and the second clock signal, the second PFD to generate a second output indicating the fine phase difference.

21 Claims, 8 Drawing Sheets

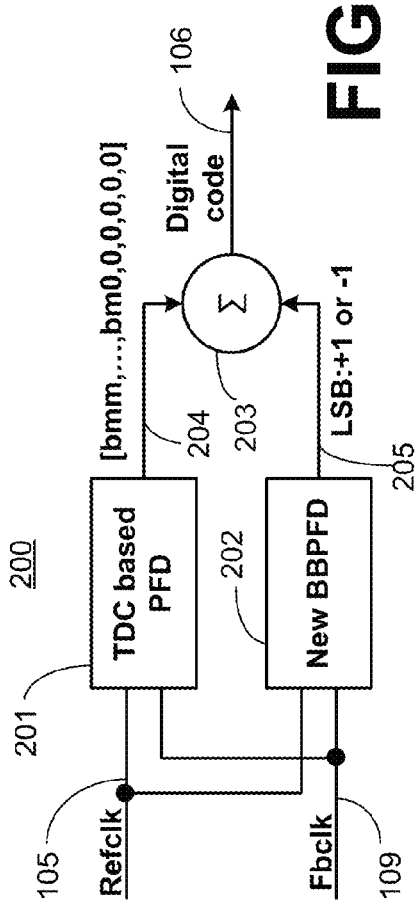
FIG. 2
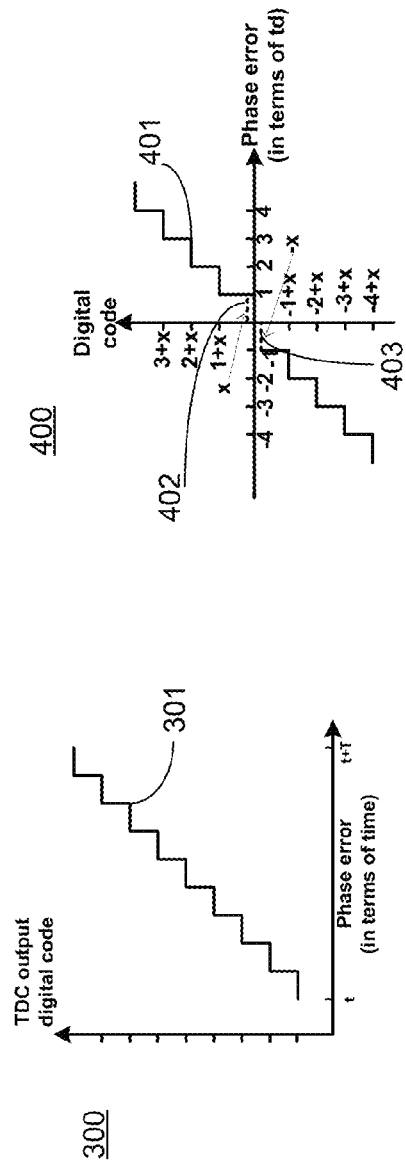
FIG. 4
FIG. 3

PHASE FREQUENCY DETECTOR

BACKGROUND

As technology moves into nano-scale Complementary Metal Oxide Semiconductor (CMOS), analog Phase Locked Loop (PLL) design faces more and more challenges attributed to device matching, reduced output impedance, and low supply voltage. Digital PLLs (DPLLs) may sometimes replace analog PLLs, but generally suffer from low jitter performance i.e., high jitter at the output of the PLL.

PLLs employ phase frequency detectors (PFDs). A PFD compares a reference clock signal with a feedback clock signal to determine whether to increase the frequency of an oscillator of the PLL, reduce the frequency of the oscillator, or keep the frequency of the oscillator constant. The output of the PFD includes phase error even when the reference clock signal and the feedback clock signal are aligned. This phase error of the PFD may add jitter to the output clock of the PLL, and so may reduce PLL performance.

BRIEF DESCRIPTION OF THE DRAWINGS

Embodiments of the disclosure will be understood more fully from the detailed description given below and from the accompanying drawings of various embodiments of the disclosure, which, however, should not be taken to limit the disclosure to the specific embodiments, but are for explanation and understanding only.

FIG. 2 is the PFD formed from combination of two PFDs, according to one embodiment of the disclosure.

FIG. 3 is a transfer function of a delay line of the first PFD, according to one embodiment of the disclosure FIG. 4 is a transfer function of the combination of two PFDs, according to one embodiment of the disclosure.

DETAILED DESCRIPTION

Figure 1:
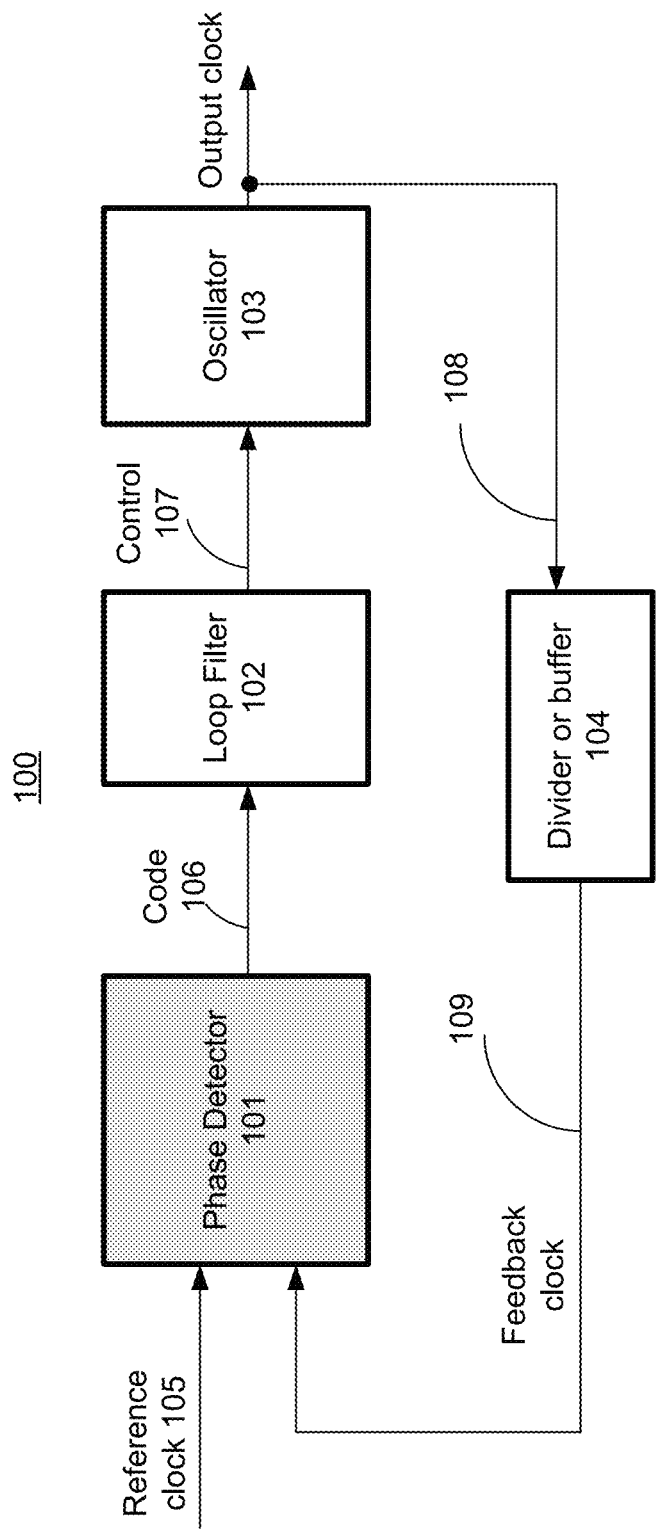
FIG. 1 is a clock generation unit including a frequency phase detector (PFD) formed from combination of two PFDs, according to one embodiment of the disclosure.

The embodiments of this disclosure present a novel phase frequency detector (PFD). A PFD compares two signals, a reference signal and another signal, to determine whether the other signal is ahead or behind in time domain relative to the reference signal. The new PFD discussed herein significantly improves the phase detection resolution of a delay-line based time-to-digital converter (TDC) PFD.

In one embodiment, a Bang-Bang (BB) PFD (BBPFD) is combined with the TDC based PFD to form the novel PFD. The embodiments of the PFD discussed herein may be used as a stand-alone circuit in various circuits. For example, the PFD discussed herein may be used in a phase locked loop (PLL) such as a digital PLL (DPLL). PFD discussed herein may also be used in a delay locked loop (DLL). In one embodiment, by combining the BBPFD and TDC based PFD together, the time domain quantization error of the DPLL PFD is reduced to much less than a TDC unit delay. In one embodiment, by combining the BBPFD and TDC based PFD together, the new PFD has substantially the same linear characteristic as TDC based PFD.

In such an embodiment, significant improvement is observed in the DPLL's jitter performance. In one embodiment, the performance (i.e., resolution) of the DPLL PFD is determined by the BBPFD. In one embodiment, by combining the BBPFD and TDC based PFD together, the trade-off between jitter performance and TDC hardware complexity seen in TDC based DPLLs is decoupled. In such an embodiment, power consumption and semiconductor area savings are realized via fewer delay line stages compared to a traditional TDC without compromising the TDC linearity. Other technical effects will be evident from various embodiments discussed herein The terms "substantially," "close," "approximately," herein refer to being within +/−20% of a target value.

The embodiments herein are discussed with reference to a DPLL. However, the new PFD formed by combining the TDC based PFD and the BBPFD can be used in other circuits. For example, the embodiments of the new PFD may be used in a delay locked loop (DLL).

TDC alone based DPLLs are used because of their close to linear transfer function. Such TDCs use delay, $td_{tdc}$, to digitize phase error between the reference signal and the other signal (generally a feedback clock signal). Quantization noise is defined by this $td_{tdc}$, or the minimum delay that the process technology could provide. Equation 1 shows the relation of the quantization noise power spectrum to the unit delay of the TDC, $td_{tdc}$.

$$\text{Quantization Noise power is proportional to } N^2 * td_{tdc}^2/12 \quad \text{Equation 1}$$

where 'N' is the PLL divider ratio. The number of useful stages in the delay chain of the TDC is constrained by the minimum $td_{tdc}$ and the time period of the oscillator (e.g., voltage controlled oscillator or digitally controlled oscillator) cycle as illustrated by Equation 2.

$$\text{TDC Delay Chain Stages} = Tvco/td_{tdc} \quad \text{Equation 2}$$

The smaller $td_{tdc}$ is the larger number of TDC delay stages are needed to keep the PFD gain constant over a certain phase range, such as one oscillator cycle. Therefore a trade-off between the jitter performance and the number of stages in the TDC exists as shown by Equations 1 and 2.

In the embodiments discussed herein, a BBPFD is combined with a TDC based PFD to provide, among other advantages, the advantage of design simplicity, high precision in phase error detection, lower power consumption, and lower silicon area compared to a TDC alone based PFD.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct electrical connection between the things that are connected, without any intermediary devices. The term "coupled" means either a direct electrical connection between the things that are connected, or an indirect connection through one or more passive or active intermediary devices. The term "circuit" means one or more passive and/or active components that are arranged to cooperate with one another to provide a desired function. The term "signal" means at least one current signal, voltage signal or data/clock signal. The meaning of "a", "an", and "the" include plural references. The meaning of "in" includes "in" and "on."

As used herein, unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

For purposes of the embodiments described herein, the transistors are metal oxide semiconductor (MOS) transistors, which include drain, source, gate, and bulk terminals. Source and drain terminals may be identical terminals and are interchangeably used herein. Those skilled in the art will appreciate that other transistors, for example, Bi-polar junction transistors—BJT PNP/NPN, BiCMOS, CMOS, eFET, etc., may be used without departing from the scope of the disclosure. The terms "MN" herein indicates an n-type transistor (e.g., NMOS, NPN BJT, etc) and the term "MP" indicates a p-type transistor (e.g., PMOS, PNP BJT, etc).

FIG. 1 is a clock generation unit 100 including a PFD formed from the combination of two PFDs, according to one embodiment of the disclosure. In one embodiment, the clock generation unit 100 comprises a PFD 101, a loop filter 102, an oscillator 103, and a divider 104. In one embodiment, the PFD 101 receives a reference clock signal 105 and a feedback clock signal 109.

In one embodiment, the PFD 101 generates output code 106 which is formed from a combination of codes from at least two PFDs in the PFD 101. In one embodiment, the output code 106 is received by the loop filter 102 that generates a filtered version of the code 106 in the form of a control signal 107. In one embodiment, the control signal 107 is provided to the oscillator 103, where the control signal 107 is used to adjust the operating frequency of the oscillator 103. In one embodiment, the oscillator 103 is a voltage controlled oscillator (VCO). In another embodiment, the oscillator 103 is a digitally controlled oscillator (DCO).

The output 108 of the oscillator 103 is then received by the divider 104 that divides the frequency of the output 108 to match the frequency of the reference clock signal 105. In one embodiment, the divider 104 is an integer divider. In one embodiment, the divider 104 is a fractional divider. In other embodiments, other forms of the divider 104 may be used, for example, a multi-phase modulus divider.

In the embodiments discussed herein, PFD 101 comprises a first PFD to determine a coarse phase difference between a first clock signal (reference clock signal 105) and a second clock signal (feedback clock signal 109). In one embodiment, the first PFD is operable to generate (or generates) a first output indicating the coarse phase difference. In one embodiment, PFD 101 comprises a second PFD, coupled to the first PFD, to determine a fine phase difference between the first clock signal (reference clock signal 105) and the second clock signal (feedback clock signal 109). In one embodiment, the second PFD is operable to generate (or generates) a second output indicating the fine phase difference. In one embodiment, the PFD 101 further comprises an adder which is operable to sum (or sums) the first and second outputs to generate a resultant phase difference between the first clock signal and the second clock signal. The first and the second PFDs are shown in FIG. 2 and FIGS. 5-8.

Referring back to FIG. 1, in one embodiment the first PFD is operable to provide a substantially linear characteristic over a wide phase difference of the first clock signal and the second clock signal. In one embodiment, the first and second PFDs operate in parallel. In one embodiment, the first and second PFDs operate sequentially. For example, the first PFD first starts its analysis bringing the phase difference small (e.g., within 1 to 2 $td_{tdc}$ delays) and then the second PFD begins to analyze the first and second clock signals. In one embodiment, the first PFD is a TDC based PFD. In one embodiment, the second PFD is a BBPFD.

In one embodiment, block 104 is a buffer instead of a divider. In such an embodiment, a buffered version 109 of the output 108 of the oscillator 103 is received by the PFD 101. In one embodiment, the output 108 of the oscillator 103 is directly received by the PFD 101. In such an embodiment, signal 109 and signal 108 are the same signals.

FIG. 2 is the PFD 200 formed from the combination of two PFDs, according to one embodiment of the disclosure. In one embodiment, the PFD 200 comprises a TDC based PFD 201, a BBPFD 202, and an adder 203. In one embodiment, both the TDC based PFD 201 and the BBPFD 202 receive the reference clock signal (Refclk) 105 and the feedback clock signal (Fbkclk) 109. In one embodiment, the Most Significant Bits (MSBs) of the PFD code 106 are determined by the TDC output 204. In one embodiment, the BBPFD 202 detects phase error much smaller than the TDC unit delay, $td_{tdc}$.

In one embodiment, the BBPFD 202 determines the Least Significant Bit (LSB) of the PFD code 106. In one embodiment, the output code 205 of BBPFD 202 indicates whether a positive '1' or negative '1' should be added to the code 204 by the adder 203. In one embodiment, the BBPFD 202 determines a short code 205 (e.g., one or two bit code) which is linearly added to the TDC output 204. In one embodiment, the short code 205 may be added starting from the LSB of the TDC output 204. In other embodiments, the short code 205 may be added anywhere in the TDC output 204. In one embodiment, the short code 205 is as long as the bits of TDC output 204 wherein the short code includes many zero bits.

In one embodiment, after the DPLL 101 is locked by the TDC 201, the effects of the BBPFD 202 appear. For example, the DPLL 101 will lock using the coarse code 204 from the PFD 200 and then will lock using the fine code 205 combined with the coarse code 204. In one embodiment, early or late indication (whether feedback clock 109 is ahead or behind reference clock 105) from the BBPFD 202 output 205 controls the oscillator 103 and aligns the feedback clock 109 to reference clock 105 precisely.

FIG. 3 is a transfer function 300 of a delay line of the first PFD 201, according to one embodiment of the disclosure. In this embodiment, the first PFD 201 is the TDC based PFD 201. The x-axis is the phase error in time and the y-axis is the output 204 of the TDC based PFD 201 (also referred herein as TDC 201). The gain of digital code to the phase error (in terms of time) is approximated to $1/td_{tdc}$. The transfer function 300 of the delay line of the TDC based PFD 201 is a staircase waveform 301 as shown. Separately, the transfer function of a BBPFD 202 has an infinite gain at zero phase error, and zero gain elsewhere. The transfer function is central symmetric.

FIG. 4 is a transfer function 400 of the combination of two PFDs 201 and 202, according to one embodiment of the disclosure. The x-axis is the phase error in time and the y-axis is the output 106 of the adder 203. In one embodiment, to combine the TDC 201 with the BBPFD 202, the TDC delay line is made central symmetric and bi-directional as shown by the staircase waveform 401. In such an embodiment, two '0' digital codes (402 and 403) are introduced in TDC output 204 around the zero phase error.

In one embodiment, a 1-bit output digital code 205 from BBPFD 202 is set smaller than the TDC code 204 at the ratio of 'x' which indicates the number of '0' s being added to the TDC digital output 204. For example, when 'x' is equal to 1/32, then 5 bits of '0' are added to the TDC digital output 204. In another example, when 'x' is equal to 1/64, then 6 bits of '0' are added to the TDC digital output 204. In one embodiment, when the phase error is large, the digital code 106 is dominated by the TDC output 204 while the BBPFD output 205 is constant (at 'x' or '−x'). In one embodiment, when the phase error is near zero, the TDC output 204 is zero. Within $\pm td_{tdc}$, the BBPFD output 205 dominates the digital code at 'x' or '−x.' In one embodiment, the small 'x' value is equivalent to digitizing the TDC output 204 into a very fine resolution around the zero phase error. In one embodiment, by setting 'x' to a fraction of the power of 2, the BBPFD output 205 becomes the LSB of the PFD code 106. In one embodiment, the final transfer function 400 is central symmetric. In one embodiment, when the PLL 100 is locked, it will not introduce any phase offset between the reference clock 105 and the feedback clock 109.

Figure 5A:
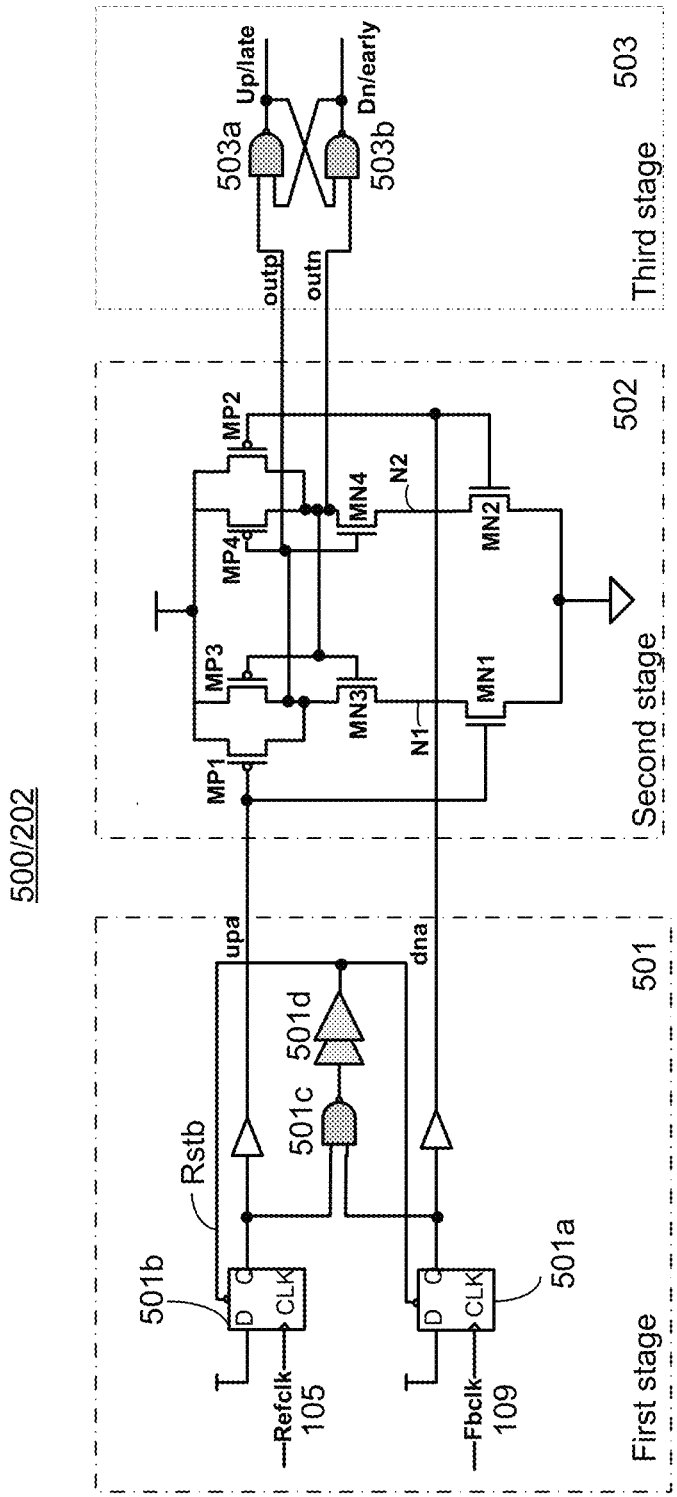
FIG. 5A is a bang-bang PFD (BBPFD), according to one embodiment of the disclosure.

FIG. 5A is a BBPFD 500/202, according to one embodiment of the disclosure. In one embodiment, the BBPFD 500/202 comprises a first stage 501, a second stage 502, and a third stage 503. In one embodiment, the first stage 501 detects edges of the first (reference clock "Refclk" 105) and second clock (feedback clock "Fbclk" 109) signals.

In one embodiment, the first stage 501 comprises sequential units 501a and 501b; NAND gate 501c, and buffer 501d coupled together as shown. The output of the buffer 501d is used to reset the sequential units 501a and 501b. In one embodiment, the sequential units 501a and 501b are edge triggered data flip-flops (FFs). In other embodiments, other forms of sequential units 501a and 501b may be used. In one embodiment, the first stage 501 generates a phase difference between the first (Refclk 105) and second (Fbclk 109) clock signals.

Figure 6:
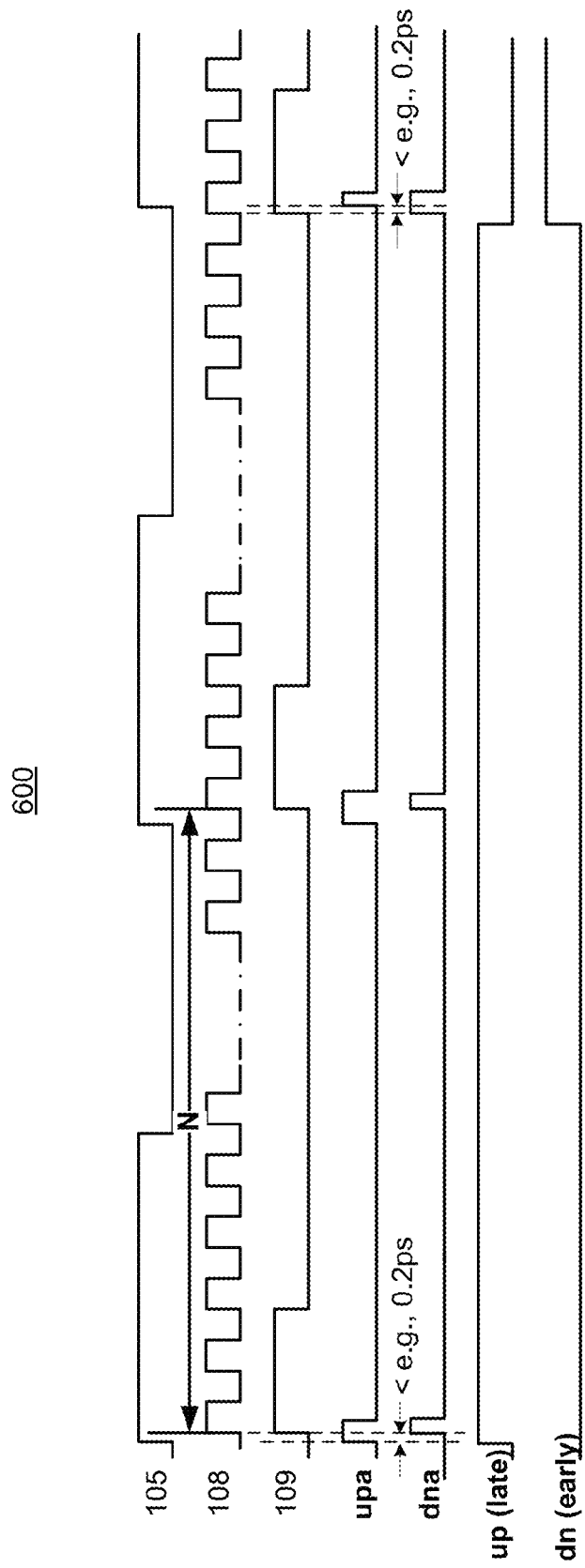
FIG. 6 is a timing diagram illustrating operation of the BBPFD, according to one embodiment of the disclosure.

In one embodiment, the first stage 501 behaves as an edge detection circuit that detects the edges of Refclk 105 and Fbclk 109. The operation of the BBPFD 500/202 is explained with reference to FIG. 6. FIG. 6 is a timing diagram 600 illustrating operation of the BBPFD 500/202, according to one embodiment of the disclosure.

In one embodiment, whichever of the two output signals from the first stage 501, "upa" and "dna," are asserted first, signifies whether the Refclk 105 or the Fbclk 109 signal edge rises first. In one embodiment, the two output signals "upa" and "dna" are de-asserted after both of them ("upa" and "dna") are high. In one embodiment, for analog PLLs, "upa" and "dna" are used to control a charge pump according to the pulse widths of the "upa" and "dna" signal. In one embodiment, for DPLLs, the first rising signal among "upa" and "dna" gives information on the earlier of the two clocks (earlier of Refclk 105 or the Fbclk 109). In such an embodiment, "upa" and "dna" need to stay latched until the next update.

In one embodiment, the BBPFD 500/202 comprises a second stage 502, coupled to the first stage 501, to sense a fine difference between edges of the first (Refclk 105) and second (Fbclk 109) clock signals. In one embodiment, the second stage 502 comprises a sense amplifier based detection circuit.

In one embodiment, the sense-amp based detection circuit 502 latches the "upa" and "dna" signals until the next transition edge of the Refclk 105 or the Fbclk 109. In one embodiment, when both the "upa" and the "dna" are in reset (i.e., logically low), p-type transistors MP1 and MP2 are on, pulling "outp" and "outn" signals high. During this time, n-type transistors MN1 and MN2 and p-type transistors MP3 and MP4 are off. In one embodiment, the n-type transistors MN3 and MN4 are on and pull nets N1 and N2 low. In such an embodiment, both left and right sides of the circuit are balanced—where the left side comprises transistors MP1, MP3, MN3, and MN1 while the right side comprises transistors MP2, MP4, MN4, and MN2.

In one embodiment, whenever "upa" or "dna" signals are asserted high, the corresponding p-type transistor (MP1 or MP2) will turn off, and the corresponding n-type transistor (MN1 or MN2) will be turned on, attempting to pull the N1 or N2 nets to ground. For example, if "upa" rises, p-type transistor MP1 is off, and "outp" is not driven by the p-type transistor MP1. In such an embodiment, simultaneously, n-type transistor MN1 is on, trying to pull net N1 down. Since net "outn" still keeps high, n-type transistor MN3 device quickly pulls "outp" to low and turns off n-type transistor MN4.

In one embodiment, the latch comprises p-type transistors MP3 and MP4, and n-type transistors MN3 and MN4. In one embodiment, the latch latches the state and prevents "dna" from changing the output state. In one embodiment, the second stage 502 is able to detect a very small phase error. For example, the second stage 502 can detect a phase error of 0.2 ps or less. In one embodiment, the detection resolution of the second stage 502 is determined by the time that the input differential pair (MN1 and MN2) takes to develop a difference on nets N1 and N2 and the corresponding top latch to latch the result. In this embodiment, this resolution time is much less than two transmission gate delays and affected slightly by the input clock slopes.

In one embodiment, the BBPFD 500/202 comprises a third stage 503, coupled to the second stage 502, to latch output of the second stage 502. In one embodiment, the two signals "outp" and "outn" are latched by the NAND-latch (503a and 503b), before "upa" and "dna" signals are in reset (i.e., logically low). In one embodiment, when "upa" and "dna" are both reset to low, and "outp" and "outn" become both high, the BBPFD 500/202 output result of Dn/early or Up/late will not change.

Figure 5B:
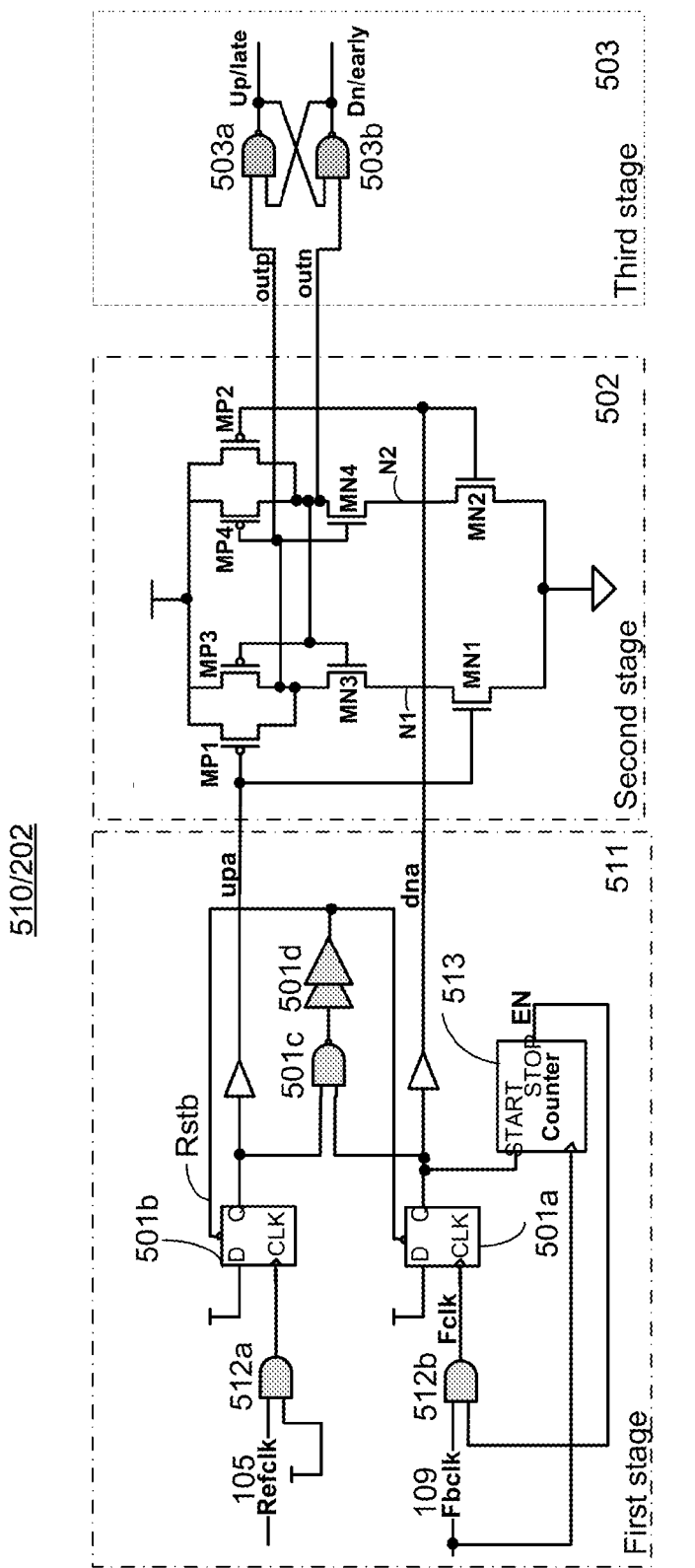
FIG. 5B is a BBPFD, according to another embodiment of the disclosure.

FIG. 5B is a BBPFD 510/202, according to one embodiment of the disclosure. In one embodiment, the BBPFD 510/202 comprises a first stage 501, a second stage 502, and a third stage 503. Since BBPFD 510/202 is similar to BBPFD 500/202, so as not to obscure the embodiments of the disclosure, the differences between BBPFD 510/202 and BBPFD 500/202 are discussed.

As discussed with reference to FIG. 1, in one embodiment the divider 104 is replaced by a buffer or eliminated. In such an embodiment, signal 109 and signal 108 are substantially the same signals with the same frequencies. In this embodiment, the first stage 511 of the BBPFD 510 is modified compared to the first stage 501 of the BBPFD 510 of FIG. 5A.

In one embodiment, BBPFD 510 receives the Fbclk 109 (same as 108) which is used to generate the internal Fclk signal for the FF 501*a*. In one embodiment, the internal Fclk signal is generated by logic gate 512*b* that receives an enable signal EN and the Fbclk 109 (same as 108). In one embodiment, the same logic gate is used in the signal path of Refclk 105 to keep the signal paths of Fbclk 109 and Refclk 105 substantially the same (in terms of delay). In such an embodiment, one of the inputs to the logic gate 512*a* is held constant to enable the logic gate 512*a*. In one embodiment, the logic gates 512*a* and 512*b* are AND gates. In other embodiments, other logic gates may be used with slight design modifications to the first stage 511 to keep it logically operational. For example, a NAND gate followed by an inverter may replace the AND gates.

In one embodiment, the enable signal EN is generated by a counter 513. In one embodiment, the counter 513 performs the same functions as the divider 104 of FIG. 1. For example, with reference to FIG. 5A when the divider is set to divider-by-14, then with reference to FIG. 5B the counter will generate the EN signal every 14 Fbclk 109 (same as 108) cycles. In such an embodiment, Fbclk and Refclk 105 have substantially the same frequencies.

Figure 7:
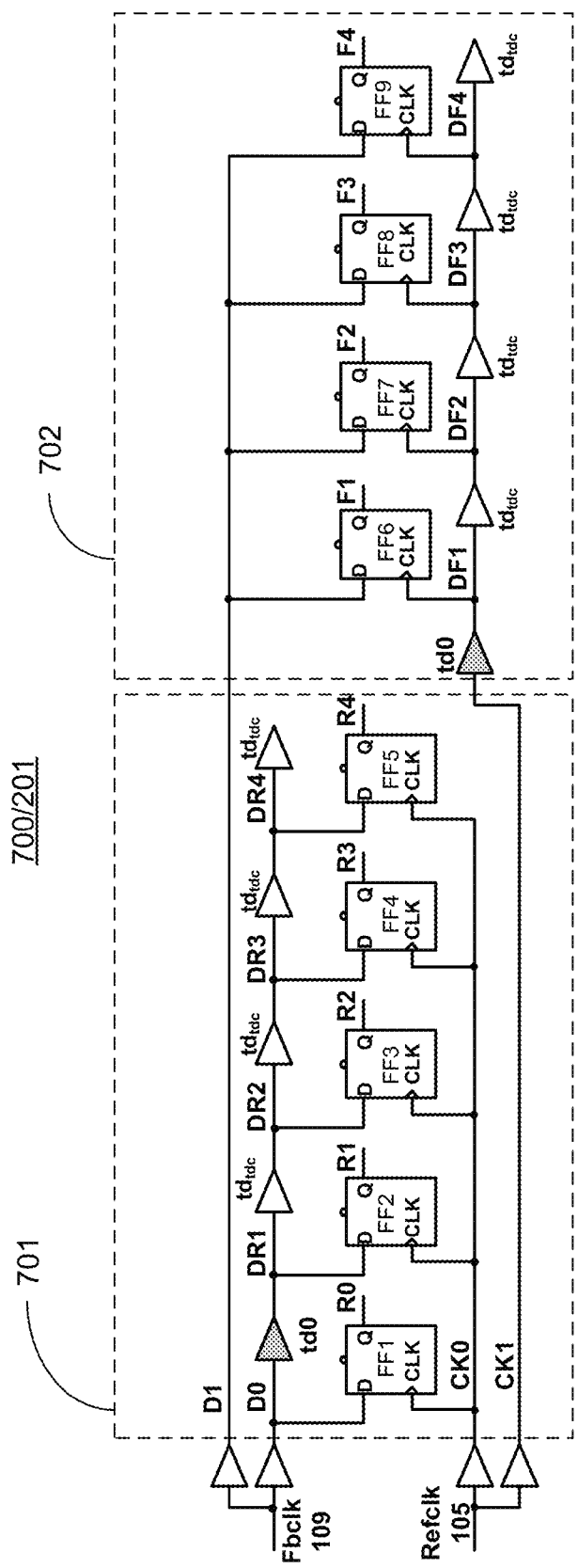
FIG. 7 is a time-to-digital converter (TDC) based PFD, according to one embodiment of the disclosure.
Figure 8:
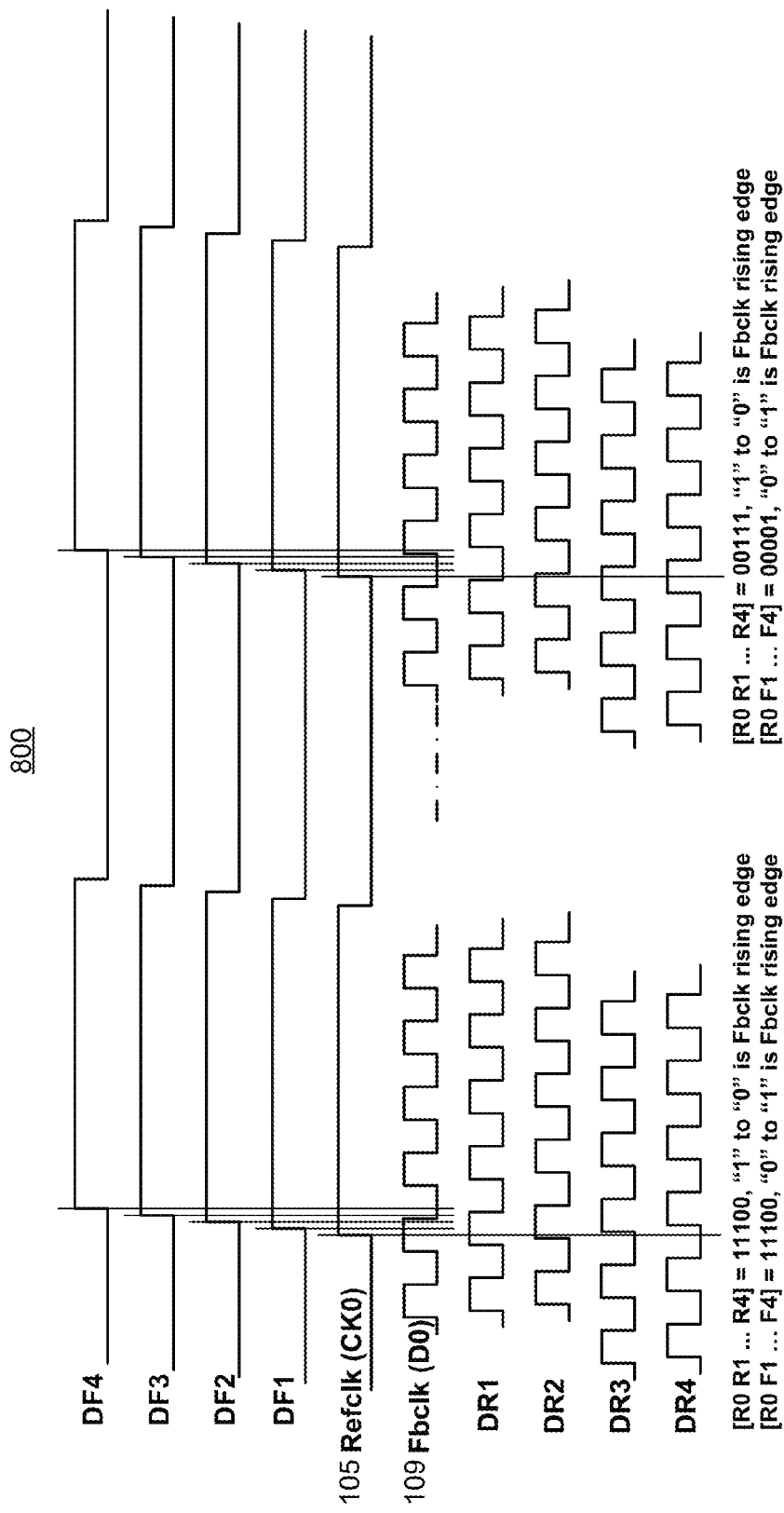
FIG. 8 is a timing diagram illustrating operation of the TDC, according to one embodiment of the disclosure.

FIG. 7 is a TDC delay-line based PFD 700/201, according to one embodiment of the disclosure. In one embodiment, the TDC 700/201 is bi-directional. FIG. 7 is described with reference to FIG. 8 and other figures. FIG. 8 is a timing diagram 800 illustrating operation of the TDC 700/201, according to one embodiment of the disclosure.

In one embodiment, the TDC 700/201 comprises a left part 701 and right part 702. The left part 701 and right part 702 circuits may be organized in any fashion and the use of the terms "left" and "right" is being used to simplify the discussion.

In one embodiment, the left delay line of the left part 701 comprises buffers with delay td0 and $td_{tdc}$. In one embodiment, the left part 701 detects an early Fbclk 109 by using the Refclk 105 to sample the delayed Fbclk 109 via FFs FF1-5. The first '1' to '0' code transition on R0, R1, R2, R3, and R4 represents the rising edge of the feedback clock. While the left part 701 shows five delay stages and five FFs, any number of delay stages and FFs may be used.

In one embodiment, the right delay line of the right part 702 comprises buffers with delay "td0" and $td_{tdc}$. In one embodiment, right side part 702 detects a late Fbclk 109 by using a delayed Refclk 105 to sample the Fbclk 109 via FFs FF6-9. The first '0' to '1' code transition on R0, F1, F2, F3, and F4 represents the rising edge of the Fbclk 109. While the right part 702 shows 4 delay stages and four FFs, any number of delay stages and FFs may be used. In one embodiment, the number of delay stages and FFs in the left part 701 and right part 702 are equal. In one embodiment, the number of delay stages and FFs in the left part 701 and right part 702 are different.

In one embodiment, the early or late status of the phase of Refclk 105 and Fbclk 109 is determined by which rising edge of the Refclk 105 and Fbclk 109 arrives first. In one embodiment, each delay line covers half cycle of the oscillator 103 output signal 108 to maintain linearity over one cycle.

For example, at the first rising edge of the Refclk 105, the code of R0, R1, R2, R3, and R4 is "11100." In this example, code of R0, F1, F2, F3, and F4 is also "11100." In one embodiment, transition of '1' to '0' comes first in the left delay line of the left part 701. In example, the feedback clock is two to three delay cells earlier than the reference clock. In one embodiment, transition of '0' to '1' won't happen in the right delay line of the right part 702.

At the second rising edge of Refclk 105, the code R0, R1, R2, R3, and R4 is "00111." In this example, code of R0, F1, F2, F3, F4 is "00001." In one embodiment, the transition of '0' to '1' comes first in the right delay line of the right part 702. Therefore, the Fbclk 109 is three to four delay cells earlier than the Refclk 105. In one embodiment, the rising edges on both delay lines of the left part 701 and the right part 702 are detected. In such an embodiment, the total number of delay stages covers one oscillator 103 output clock 108 cycle to well define the phase detection characteristic, or transfer function over one cycle. In one embodiment, the rising edges on both delay lines of the left part 701 and the right part 702 are not detected. In this embodiment, the inputs (Refclk 105 and Fbclk 109) to the TDC based PFD 201 are at Refclk 105 frequency. In such an embodiment, the early or late arrival of the Fbclk 109 relative to the Refclk 105 is determined by the BBPFD output 205, with the delay output 204 of TDC part 701 or part 702.

In one embodiment, the shaded delay cells with delay "td0" in the left part 701 and the right part 702 may have programmable delays to adjust the step size around the zero crossing. In one embodiment, one or more of the delay cells (with delay labeled as $td_{tdc}$) may have programmable delays. By programming the delays of one or more delay cells, the step size around the zero crossing can be made small for noise improvement.

Figure 9:
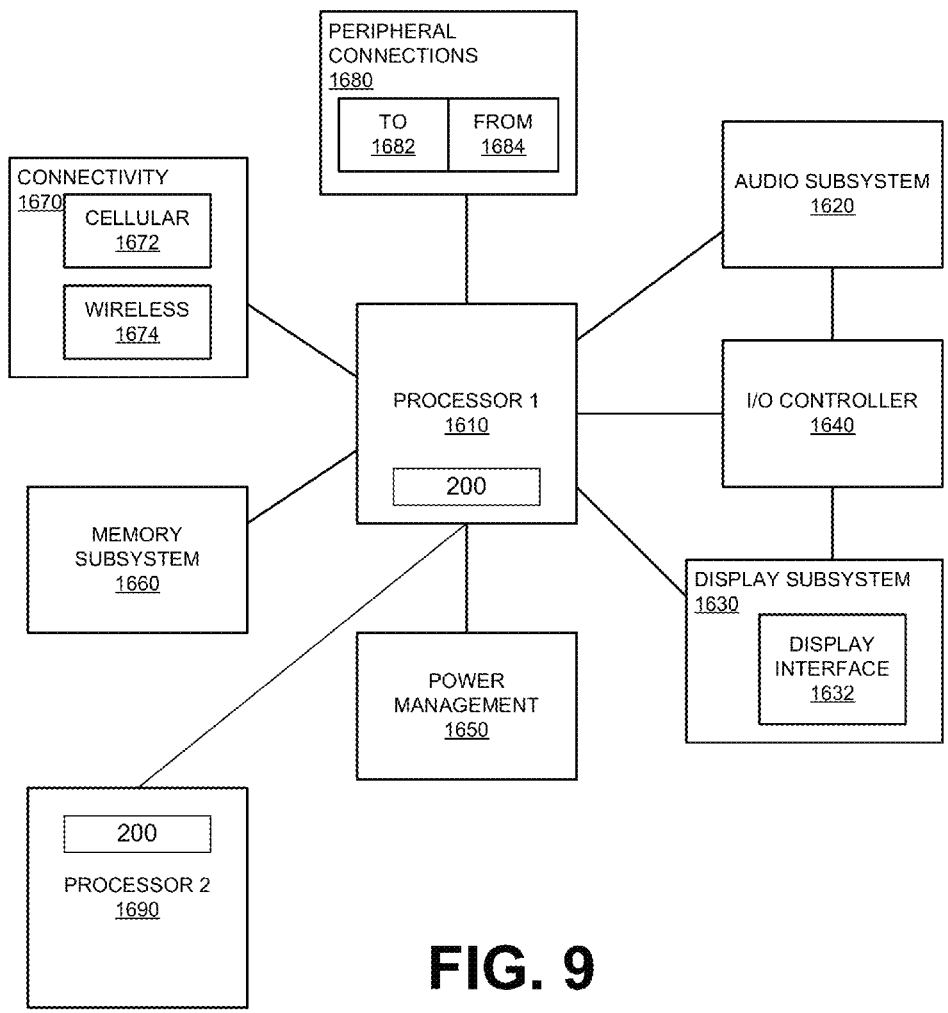
FIG. 9 is a system-level diagram of a smart device comprising a processor with the combination of two PFDs and/or the BBPFD and/or TDC, according to one embodiment of the disclosure.

FIG. 9 is a system-level diagram of a smart device 1600 comprising a processor with the combination of two PFDs and/or the BBPFD 202 and/or TDC 201, according to one embodiment of the disclosure. FIG. 9 also illustrates a block diagram of an embodiment of a mobile device in which flat surface interface connectors could be used. In one embodiment, the computing device 1600 represents a mobile computing device, such as a computing tablet, a mobile phone or smart-phone, a wireless-enabled e-reader, or other wireless mobile device. It will be understood that certain components are shown generally, and not all components of such a device are shown in device 1600.

In one embodiment, the computing device 1600 includes a first processor 1610 with the PFD 200 and a second processor 1690 with the PFD 200, according to the embodiments discussed herein. In one embodiment, the processors or any other device in the system 1600 may have BBPFD 202 and/or TDC 201. The various embodiments of the present disclosure may also comprise a network interface within 1670 such as a wireless interface so that a system embodiment may be incorporated into a wireless device, for example, cell phone or personal digital assistant.

In one embodiment, the processor 1610 can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, the computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. Devices for such functions can be integrated into device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to device 1600 through which a user might interact with the system. For example, devices that can be attached to the computing device 1600 might include microphone devices, speaker or stereo systems, video systems or other display device, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem includes a touch screen, the display device also acts as an input device, which can be at least partially managed by I/O controller 1640. There can also be additional buttons or switches on the computing device 1600 to provide I/O functions managed by I/O controller 1640.

In one embodiment, the I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, the computing device 1600 includes power management 1650 that manages battery power usage, charging of the battery, and features related to power saving operation. Memory subsystem 1660 includes memory devices for storing information in device 1600. Memory can include nonvolatile (state does not change if power to the memory device is interrupted) and/or volatile (state is indeterminate if power to the memory device is interrupted) memory devices. Memory 1660 can store application data, user data, music, photos, documents, or other data, as well as system data (whether long-term or temporary) related to the execution of the applications and functions of the computing device 1600.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, or other type of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity 1674 refers to wireless connectivity that is not cellular, and can include personal area networks (such as Bluetooth, Near Field, etc), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could both be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on device 1600. Additionally, a docking connector can allow device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other type.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements.

If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented i.e., such specifics should be well within purview of one skilled in the art. Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

For example, in one embodiment, the apparatus comprises: a first phase frequency detector (PFD) to determine a coarse phase difference between a first clock signal and a second clock signal, the first PFD to generate a first output indicating the coarse phase difference; and a second PFD, coupled to the first PFD, to determine a fine phase difference between the first clock signal and the second clock signal, the second PFD to generate a second output indicating the fine phase difference.

In one embodiment, the apparatus further comprises an adder to sum the first and second outputs to generate a resultant phase difference between the first clock signal and the second clock signal. In one embodiment, the first PFD is operable to provide a substantially linear characteristic over a wide phase difference of the first clock signal and the second clock signal. In one embodiment, the first and second PFDs operate in parallel. In one embodiment, the first and second PFDs operate sequentially. In one embodiment, the first PFD is a time-to-digital converter (TDC).

In one embodiment, the second PFD is a bang-bang PFD (BBPFD). In one embodiment, the BBPFD comprises a first stage to detect edges of the first and second clock signals, the first stage to generate a phase difference between the first and second clock signals. In one embodiment, the BBPFD comprises a second stage, coupled to the first stage, to sense a fine difference between edges of the first and second clock signals.

In one embodiment, the second stage comprises a sense amplifier based detection circuit. In one embodiment, the BBPFD comprises a third stage, coupled to the second stage, to latch output of the second stage. In one embodiment, the first and second PFDs and the adder are part of a PFD of a phase locked loop (PLL) or a delay locked loop (DLL). In one embodiment, the PLL is a digital PLL. In one embodiment, the first signal is a reference clock signal and the second signal is a feedback clock signal.

In another example, a phase frequency detector (PFD) comprises: a time-to-digital converter (TDC) to determine a coarse phase difference between a reference clock signal and a feedback clock signal, the TDC to generate a first output indicating the coarse phase difference; and a bang-bang PFD (BBPFD), coupled to the TDC, to determine a fine phase difference between the reference clock signal and the feedback clock signal, the BBPFD to generate a second output indicating the fine phase difference. In one embodiment, the PFD further comprises an adder to sum the first and second outputs to generate a resultant phase difference between the reference clock signal and the feedback clock signal.

In one embodiment, the TDC is operable to provide a substantially linear transfer function over a period of the reference clock signal. In one embodiment, the transfer function indicates digital code over phase difference.

In another example, a system comprises: a memory; a processor, coupled to the memory, the processor including: a first phase frequency detector (PFD) to determine a coarse phase difference between a first clock signal and a second clock signal, the first PFD to generate a first output indicating the coarse phase difference; and a second PFD to determine a fine phase difference between the first clock signal and the second clock signal, the second PFD to generate a second output indicating the fine phase difference; and a wireless interface for communicatively coupling the processor to another device.

In one embodiment, the processor further comprises an adder to sum the first and second outputs to generate a resultant phase difference between the first clock signal and the second clock signal. In one embodiment, the system further comprises a display unit. In one embodiment, the first PFD is a time-to-digital converter (TDC). In one embodiment, the second PFD is a bang-bang PFD (BBPFD).

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:

1. An apparatus comprising:
   a first phase frequency detector (PFD) to determine a coarse phase difference between a first clock signal and a second clock signal, the first PFD to generate a first digital output indicating the coarse phase difference; and
   a second PFD to determine a fine phase difference between the first clock signal and the second clock signal, the second PFD to generate a second digital output indicating the fine phase difference;
   an adder, said adder having a first input coupled to an output of said first PFD, said adder having a second input coupled to an output of said second PFD, said adder to generate a sum phase difference representative of a phase difference between said first and second clock signals.

2. The apparatus claim 1, wherein the first PFD is to provide a substantially linear characteristic over a wide phase difference of the first clock signal and the second clock signal.

3. The apparatus of claim 1, wherein the first and second PFDs are to operate in parallel.

4. The apparatus of claim 1, wherein the first and second PFDs are to operate sequentially.

5. The apparatus of claim 1, wherein the first PFD is a time-to-digital converter (TDC).

6. The apparatus of claim 1, wherein the second PFD is a bang-bang PFD (BBPFD).

7. The apparatus of claim 6, wherein the BBPFD comprises a first stage to detect edges of the first and second clock signals, the first stage to generate a phase difference between the first and second clock signals.

8. The apparatus of claim 1 wherein an output of the adder is to provide a code having most significant bits determined by the first PFD and least significant bits determined by the second PFD.

9. The apparatus of claim 8, wherein an output signal of the first PFD is padded with 0s in least significant bit locations.

10. The apparatus of claim 1, wherein an output signal of the second PFD indicates a fixed quantity to be added/subtracted by the adder to/from the output of the first PFD.

11. The apparatus of claim 1, wherein the first and second PFDs and the adder are part of a PFD of a phase locked loop (PLL) or a delay locked loop (DLL).

12. The apparatus of claim 11, wherein the first and second PFDs and the adder are part of a PFD of a PLL and the PLL is a digital PLL.

13. The apparatus of claim 1, wherein the first signal is a reference clock signal and the second signal is a feedback clock signal.

14. A phase frequency detector (PFD) comprising:
a time-to-digital converter (TDC) to determine a coarse phase difference between a reference clock signal and a feedback clock signal, the TDC to generate a first output indicating the coarse phase difference; and
a bang-bang PFD (BBPFD), coupled to the TDC, to determine a fine phase difference between the reference clock signal and the feedback clock signal, the BBPFD to generate a second output indicating the fine phase difference;
an adder to sum the first and second outputs.

15. The PFD of claim 14, wherein the TDC is to provide a substantially linear transfer function over a period of the reference clock signal.

16. The PFD of claim 15, wherein the transfer function is expressed as a digital code as a function of phase difference.

17. A system comprising:
a memory;
a processor, coupled to the memory, the processor including:
a first phase frequency detector (PFD) to determine a coarse phase difference between a first clock signal and a second clock signal, the first PFD to generate a first digital output indicating the coarse phase difference; and
a second PFD to determine a fine phase difference between the first clock signal and the second clock signal, the second PFD to generate a second digital output indicating the fine phase difference; and
an adder to sum the first and second digital outputs;
a wireless interface for communicatively coupling the processor to another device.

18. The system of claim 17, wherein the processor further comprises an adder to sum the first and second digital outputs to generate a resultant phase difference between the first clock signal and the second clock signal.

19. The system of claim 17 further comprises a display unit.

20. The system of claim 17, wherein the first PFD is a time-to-digital converter (TDC).

21. The system of claim 17, wherein the second PFD is a bang-bang PFD (BBPFD).

\* \* \* \* \*